(12) United States Patent
Li

(10) Patent No.: US 7,339,366 B2
(45) Date of Patent: Mar. 4, 2008

(54) DIRECTIONAL COUPLER FOR A ACCURATE POWER DETECTION

(75) Inventor: Ping Li, Dunstable, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/475,783

(22) Filed: Jun. 27, 2006

(65) Prior Publication Data

US 2007/0296397 A1    Dec. 27, 2007

(51) Int. Cl.
  *G01R 23/04* (2006.01)
(52) U.S. Cl. .................................................. 324/95
(58) Field of Classification Search ................. 324/95, 324/142; 702/116, 117; 102/117
  See application file for complete search history.

(56) References Cited

U.S. PATENT DOCUMENTS

| | | | | |
|---|---|---|---|---|
| 2,724,800 | A * | 11/1955 | William et al. | 324/95 |
| 4,558,271 | A * | 12/1985 | Poole | 323/306 |
| 5,364,392 | A * | 11/1994 | Warner et al. | 606/34 |
| 6,198,293 | B1 * | 3/2001 | Woskov et al. | 324/637 |
| 6,294,894 | B1 * | 9/2001 | Ochiai et al. | 320/132 |
| 6,975,097 | B2 * | 12/2005 | Taurand et al. | 323/259 |
| 6,998,936 | B2 * | 2/2006 | Grunewald | 333/116 |
| 7,009,467 | B2 * | 3/2006 | Sawicki | 333/116 |
| 7,015,771 | B2 * | 3/2006 | Pelz | 333/111 |
| 7,164,285 | B1 * | 1/2007 | Chao et al. | 324/771 |
| 2002/0082792 | A1 * | 6/2002 | Bourde et al. | 702/107 |
| 2002/0171411 | A1 * | 11/2002 | Nasman | 324/76.52 |

OTHER PUBLICATIONS

Kim et al., "A Design of Single and Multi-Section Misrostrip Directional Coupler with High Directivity" MTT-S Digest 2004, pp. 1895-1898.
Wang et al., "Study of Meandered Microstrip Coupler with High Directivity" MTT-S Digest, 2003, pp. 63-66.
Ohta et al., "Directivity Improvement of Microstrip Coupled Line Couplers Based on Equivalent Admittance Approach" MTT-S Digest 2003, pp. 43-46.

* cited by examiner

*Primary Examiner*—Ha Tran Nguyen
*Assistant Examiner*—Joshua Benitez
(74) *Attorney, Agent, or Firm*—Gauthier & Connors LLP

(57) ABSTRACT

A power detection system implemented using a pair of directional couplers and a transmission line (or equivalent) disposed between the directional couplers, wherein the transmission line (or equivalent) provides a 90° phase shift between the directional couplers. Accurate power detection is provided by combining the powers detected at each of the directional couplers, whereby the combined power is independent of load phase. The total power in the forward case is given by $P_{c1}=2*P_f*C$, where $P_f$ is the forward power and C is the coupling coefficient the directional couplers. The total power in the reflected case is given by $P_{c1}=2*P_f*C*(\rho^2+D^2)$, where $P_f$ is the forward power, C is the coupling coefficient of said directional couplers, $\rho$ is the reflection coefficient, and D is the directivity of the directional couplers.

12 Claims, 1 Drawing Sheet

DIRECTIONAL COUPLER FOR A ACCURATE POWER DETECTION

BACKGROUND OF THE INVENTION

1. Field of Invention

The present invention relates generally to the field of power detection. More specifically, the present invention is related to the use of directional couplers for accurate power detection.

2. Discussion of Prior Art

Directional couplers are very commonly used RF/microwave devices. Many companies design, manufacture and market various types of directional couplers. The following references provide for a general teaching with regards to directional couplers:

The U.S. patent to Grunewald (U.S. Pat. No. 6,998,936) provides for a broadband microstrip directional coupler, wherein the directional coupler comprises two ports connected by a first line and two second ports connected by a second line. The lines in Grunewald extend through a coupling zone in which they are separated by a conductor area not connected to the lines.

The U.S. patent to Sawicki (U.S. Pat. No. 7,009,467) provides for a multilayer coupled-lines directional coupler of the quarter wavelength type that combines a high-efficiency with low manufacturing costs.

The U.S. patent to Pelz (U.S. Pat. No. 7,015,771) provides for a directional coupler that uses non-metallic slotted spacers at the edges of a pair of coupled lines, wherein the spatial relationship between the coupled lines is therefore adjustable and does not depend upon extremely tight manufacturing tolerances.

The non-patent literature to Wang et al. titled "A study of meandered microstrip coupler with high directivity" provides a meandered structure to improve the directivity of a microstrip direction coupler.

The non-patent literature to Kim et al. titled "A design of single and multi-section microstrip directional coupler with high directivity" outlines the use of the distributed capacitive compensation to decrease the phase difference of even and odd mode.

Prior art power detection techniques utilize a single directional coupler. Further, the primary area of focus of the prior art involves improvements to the directivity of the directional coupler to minimize the uncertainty in power detection. A common problem with the implementation of such prior art techniques is that they result in a structure that is complicated and large in size. Therefore, with prior art practices, it is very difficult to realize a miniature directional coupler with decent directivity which can be integrated into the MMIC circuit or module.

Whatever the precise merits, features, and advantages of the above cited references/prior art techniques, none of them achieves or fulfills the purposes of the present invention.

SUMMARY OF THE INVENTION

The present invention provides for a power detection system comprising: a pair of directional couplers, a transmission line disposed between the directional couplers providing a 90° phase shift between the directional couplers, and two power detectors combining power detected at each of the directional couplers, wherein the combined power is independent of load phase and is an accurate representation of the total power.

The present invention also provides for a system to detect power independent of load phase comprising: a first directional coupler, a second directional coupler, a ¼λ transmission line (or equivalent) connecting the first directional coupler to the second directional coupler in series, and two power detectors detecting power at said first and second directional couplers, with the detected power at each of the directional couplers being combined to provide accurate power detection as the combined power independent of load phase.

The present invention also provides for a method to detect power comprising the steps of: (a) measuring power at a port associated with a first directional coupler, (b) measuring power at a port associated with a second directional coupler, wherein the first directional coupler is connected in series with the second directional coupler via a transmission line that provides a 900 phase shift between the directional couplers, and (c) detecting total power by combining power detected at the first directional coupler and power detected at the second directional coupler, wherein the combined power is independent of load phase, thereby providing accurate power detection.

According to the present invention, the total power in the forward case is given by $P_{c1}=2*P_f*C$, where $P_f$ is the forward power and C is the coupling coefficient of the directional couplers. According to the present invention, the total power in the reflected case is given by $P_{c1}=2*P_f*C*(\rho^2+D^2)$, where $P_f$ is the forward power, C is the coupling coefficient of said directional couplers, $\rho$ is the reflection coefficient, and D is the directivity of the directional couplers.

The methods and systems of the present invention do not rely on the high directivity of the directional coupler to achieve power detection accuracy and, hence, allow the design of the individual directional couplers to be realized in a very small size. Further, the present invention can be integrated into MMIC circuits and modules to achieve accurate power detection.

Although the illustrated example shows the directional couplers connected in series, it should be noted that the present invention can also be implemented with the directional couplers in parallel with a 90° phase shift between them. Such modifications are within the scope of the present invention.

DESCRIPTION OF THE PREFERRED EMBODIMENTS

Figure 1:
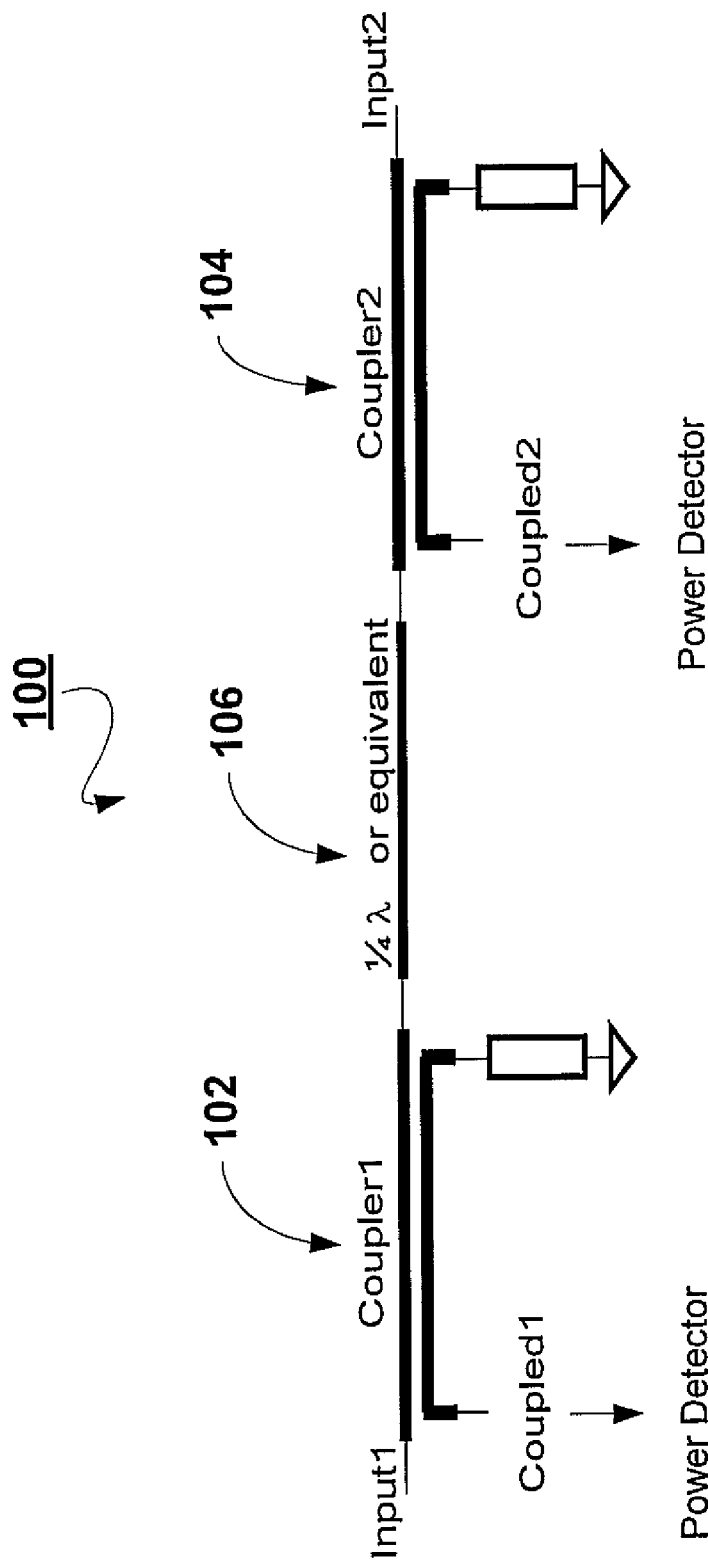
FIG. 1 illustrates an exemplary embodiment of the present invention's setup having two directional couplers.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

FIG. 1 illustrates an exemplary embodiment of the present invention's setup 100 having two directional couplers 102 and 104. In the preferred embodiment, couplers 102 and 104 are connected in series with a ¼ wavelength transmission line 106 or equivalent. It should be noted that the two isolation ports can either be loaded with 50 ohm loads, as shown in the figure or loaded with external loads. If input1 is connected to the source, then the coupler is set to measure the forward power from the source. If input1 is connected to the load, then the coupler is set to measure the reflected power from the load. Further, the isolation ports can also be used to measure reflected power directly.

In one scenario where the setup is connected for forward power detection, the source is connected to the input 1 and input 2 is connected to a load with an unknown reflection coefficient of $\rho$ and phase of $\phi$. Also, assuming both Coupler 1 and Coupler 2 are identical which have same coupling coefficient of C and directivity of D with negligible loss. The coupled forward power measured from the Coupled1 port $P_{c1}$ can be calculated as following:

$$P_{c1}=P_f{}^*C^*(1+\rho^2{}^*D+2^*\rho^*D^{1/2}{}^*\cos\phi) \qquad (1)$$

Since $\rho$ is less than 1 and D is much less than 1, $\rho^2{}^*D<2^*\rho^*D^{1/2}<<1$ is true for majority of the cases. (1) can be rewritten as following without sacrificing accuracy significantly.

$$P_{c1}=P_f{}^*C^*(1+2^*\rho^*D^{1/2}{}^*\cos\phi) \qquad (2)$$

As shown in (2) for a given reflection coefficient $\rho$ the measured forward power is a function of the load phase angle $\phi$. For a given VSWR the measured forward power will change as the load phase changes. And as D approaches zero the measured forward power $P_{c1}$ will approach $P_f{}^*C$.

In another scenario, if the input1 is connected to the load and input 2 is connected to the source, the coupler is set to measure the reflected power, by going through the similar math, it can be shown that the reflected power $P_r$ measured at coupled 1 is:

$$P_{c1}=P_f{}^*C^*(\rho^2+D^2+2^*\rho^*D^{1/2}{}^*\cos\phi) \qquad (3)$$

Again, the measured reflected power is a function of load phase and as load phase changes the measured reflected power changes accordingly, although the true reflected power does not change. Again as D approaches zero, $$P_{c1}=P_f{}^*C^*\rho^2 \qquad (4)$$

It should be noted that $P_r=P_f{}^*\rho^2$

Since the load phase $\phi$ depends on the characteristics of the load and system implementation, it is impossible to know and, consequently, to compensate the detection error caused by the load phase. The conventional way to solve this problem is to use high directivity couplers if high accuracy is desired. Extensive researches have been going on in the microwave society for many years pursuing high directivity couplers. However, high directivity couplers are still expensive, bulky and very hard, if not impossible, to get integrated into MMIC circuits or modules.

This invention uses a different approach to eliminate the ill effect arising from the finite directivity issue. For power detection purpose the absolute load phase information is not of primary interest as long as the measured power is not a function of the load phase. The invention works as described below.

If another power detector is used to detect the power at Coupled 2, a very similar measured power will be obtained for both forward and reflection cases. But since there is a 90 degree relative phase difference between coupler 1 and coupler 2 with respect to the load, the measured power from Coupled 2 port will be:

$$P_{c1}=P_f{}^*C^*[1+2^*\rho^*D^{1/2}{}^*\cos(\phi-180)] \qquad (5)$$

For forward case and $$P_{c1}=P_f{}^*C^*[\rho^2+D^2+2^*\rho^*D^{1/2}{}^*\cos(\phi-180)] \qquad (6)$$

For reflected case.

If the detected powers from Coupled1 port and Coupled2 port are combined, the total power will be:

$$P_{c1}=2^*P_f{}^*C \qquad (7)$$

for the forward case and $$P_{c1}=2^*P_f{}^*C^*(\rho^2+D^2) \qquad (8)$$

for reflected case.

As shown in (7) and (8), by adding another directional coupler and summing the detected power from both detectors the variation in each individual detected power due to the load phase gets cancelled out. The combined power is not a function of the load phase and the ill effect of the finite directivity of the coupler is nothing more than a constant offset which can be calibrated out in advance, as long as the characteristics of the coupler is well known. Thus the accurate power detection can be achieved without any knowledge of the load phase.

The present invention also provides for a method to detect power comprising the steps of: (a) measuring power at a port associated with a first directional coupler, (b) measuring power at a port associated with a second directional coupler, wherein the first directional coupler is connected in series with the second directional coupler via a transmission line that provides a 90° phase shift between the directional couplers, and (c) detecting total power by combining power detected at the first directional coupler and power detected at the second directional coupler, wherein the combined power is independent of load phase, thereby providing accurate power detection.

CONCLUSION

A system and method has been shown in the above embodiments for the effective implementation of directional couplers for accurate power detection. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by specific hardware or whether the directional couplers are connected in series or parallel.

The invention claimed is:

1. A power detection system comprising:
   a pair of directional couplers;
   a transmission line disposed between said directional couplers and providing a 90° phase shift between said directional couplers; and
   a pair of power detectors detecting power at each of said directional couplers,
   said detected power at each of said directional couplers combined to provide accurate power detection, said combined power independent of load phase, and said combined power in a forward case being given by $P_{c1}=2^*P_f{}^*C$, where $P_f$ is the forward powers and C is the coupling coefficient the directional couplers.

2. A power detection system, as per claim 1, wherein said transmission line connects said directional couplers in series.

3. A power detection system, as per claim 1, wherein said power detection system is integrated into a monolithic microwave integrated circuit or module.

4. A power detection system, as per claim 1, wherein said combined power in a reflected case is given by:

$$P_{c1}=2*P_f*C*(\rho^2+D^2)$$

where $P_f$ is the forward power, C is the coupling coefficient of said directional couplers, $\rho$ is the reflection coefficient, and D is the directivity of said directional couplers.

5. A system to detect power independent of load phase comprising:
   a first directional coupler;
   a second directional coupler;
   a ¼λ transmission line connecting said first directional coupler to said second directional coupler in series; and
   a pair of power detectors detecting power at said first and second directional couplers,
   said detected power at each of said directional couplers combined to provide accurate power detection, said combined power independent of load phase, and said combined power in a forward case being given by $P_{c1}=2*P_f*C$, where $P_f$ is the forward power, and C is the coupling coefficient the directional couplers.

6. A system to detect power independent of load phase, as per claim 5, wherein said system is integrated into a monolithic microwave integrated circuit or module.

7. A system to detect power independent of load phase, as per claim 5, wherein said combined power in a reflected case is given by:

$$P_{c1}=2*P_f*C*(\rho^2+D^2)$$

where $P_f$ is the forward power, C is the coupling coefficient of said first directional coupler and said second directional coupler, $\rho$ is the reflection coefficient, and D is the directivity of said first directional coupler and said second directional coupler.

8. A system to detect power independent of load phase integrated into a monolithic microwave integrated circuit or module, said integrated system comprising:
   a first directional coupler;
   a second directional coupler;
   a transmission line connecting said first directional coupler to said second directional coupler in series, said transmission line providing 90° phase shift between said first and second directional coupler; and
   a pair of power detectors combining power detected at said first and second directional couplers, said detected power at each of said directional couplers being combined to provide accurate power detection, said combined power independent of load phase, and said combined power in a forward case being given by $P_{c1}=2*P_f*C$, where $P_f$ is the forward power, and C is the coupling coefficient the directional couplers, and said combined power in a reflected case is given by $P_{c1}=2*P_f*C*(\rho^2+D^2)$ where $P_f$ is the forward power, C is the coupling coefficient of said first directional coupler and said second directional coupler, $\rho$ is the reflection coefficient, and D is the directivity of said first directional coupler and said second directional coupler.

9. A method to detect power comprising:
   measuring power at a port associated with a first directional coupler;
   measuring power at a port associated with a second directional coupler, said first directional coupler connected in series with said second directional coupler via a transmission line, said transmission line providing a 90° phase shift between said first directional coupler to said second directional coupler; and
   detecting total power by combining power detected at said first directional coupler and power detected at said second directional coupler, said combined power independent of load phase, thereby providing accurate power detection, and said combined power in a forward case being given by $P_{c1}=2*P_f*C$, where $P_f$ is the forward power, and C is the coupling coefficient the directional couplers.

10. A method to detect power, as per claim 9, wherein said combined power in a reflected case is given by:

$$P_{c1}=2*P_f*C*(\rho^2+D^2)$$

where $P_f$ is the forward power, C is the coupling coefficient of said first directional coupler and said second directional coupler, $\rho$ is the reflection coefficient, and D is the directivity of said first directional coupler and said second directional coupler.

11. A method to detect power, as per claim 9, wherein said first and second directional couplers are implemented in conjunction with a monolithic microwave integrated circuit or module.

12. A method to detect power comprising:
   measuring power at a port associated with a first directional coupler;
   measuring power at a port associated with a second directional coupler, said first directional coupler connected in series with said second directional coupler via a transmission line, said transmission line providing a 90° phase shift between said first directional coupler to said second directional coupler; and
   detecting total power by combining power detected at said first directional coupler and power detected at said second directional coupler, said combined power independent of load phase, thereby providing accurate power detection, wherein said first and second directional couplers are implemented in conjunction with a monolithic microwave integrated circuit or module, and said combined power in a forward case being given by $P_{c1}=2*P_f*C$, where $P_f$ is the forward power, and C is the coupling coefficient the directional couplers, and said combined power in a reflected case is given by $P_{c1}=2*P_f*C*(\rho^2+D^2)$, where $P_f$ is the forward power, C is the coupling coefficient of said first directional coupler and said second directional coupler, $\rho$ is the reflection coefficient, and D is the directivity of said first directional coupler and said second directional coupler.

* * * * *